US 012356768B2

(12) United States Patent
Hien

(10) Patent No.: US 12,356,768 B2
(45) Date of Patent: Jul. 8, 2025

(54) OPTOELECTRONIC COMPONENT AND METHOD FOR PRODUCING AN OPTOELECTRONIC COMPONENT

(71) Applicant: OSRAM Opto Semiconductors GmbH, Regensburg (DE)

(72) Inventor: Matthias Hien, Kirchroth (DE)

(73) Assignee: OSRAM Opto Semiconductors GmbH, Regensburg (DE)

( * ) Notice: Subject to any disclaimer, the term of this patent is extended or adjusted under 35 U.S.C. 154(b) by 559 days.

(21) Appl. No.: 17/627,979

(22) PCT Filed: Aug. 10, 2020

(86) PCT No.: PCT/EP2020/072416
§ 371 (c)(1),
(2) Date: Jan. 18, 2022

(87) PCT Pub. No.: WO2021/028396
PCT Pub. Date: Feb. 18, 2021

(65) Prior Publication Data
US 2022/0262988 A1 Aug. 18, 2022

(30) Foreign Application Priority Data
Aug. 14, 2019 (DE) ............. 10 2019 121 881.0

(51) Int. Cl.
H10H 20/85 (2025.01)
H10H 20/81 (2025.01)
(52) U.S. Cl.
CPC ........ *H10H 20/8506* (2025.01); *H10H 20/81* (2025.01)
(58) Field of Classification Search
CPC ............. H01L 33/483; H01L 33/0008; H01L 2933/0058; H01L 25/0753
See application file for complete search history.

(56) References Cited

U.S. PATENT DOCUMENTS

2007/0195850 A1 8/2007 Schluter et al.
2010/0301355 A1* 12/2010 Wegleiter ............. H10K 50/865
438/27

(Continued)

FOREIGN PATENT DOCUMENTS

CN 1193437 C 3/2005
CN 101878539 A 11/2010
(Continued)

OTHER PUBLICATIONS

International Search Report issued for corresponding International Patent Application No. PCT/EP2020/072416 on Oct. 26, 2020, along with an English translation.

(Continued)

*Primary Examiner* — Samuel A Gebremariam
(74) *Attorney, Agent, or Firm* — Hauptman Ham, LLP

(57) ABSTRACT

An optoelectronic component includes a first semiconductor emitter and a second semiconductor emitter, each with an active region configured to generate electromagnetic radiation, and each with a front side coupling out area. The optoelectronic component also includes a radiation-impermeable cover layer and a carrier. The semiconductor emitters are on a first side of the carrier. The first semiconductor emitter is configured to emit electromagnetic radiation in a first wavelength range through its coupling out area. The second semiconductor emitter is configured to emit electromagnetic radiation in a second wavelength range through its coupling out area. The first and second wavelength ranges are different from each other. The cover layer is formed with a photopolymer, is arranged on the first side of the carrier, includes a coupling out window which completely penetrates the cover layer, and in which the coupling out areas are at least partially free of the cover layer.

20 Claims, 4 Drawing Sheets

(56) References Cited

U.S. PATENT DOCUMENTS

Figures 3, 4A:
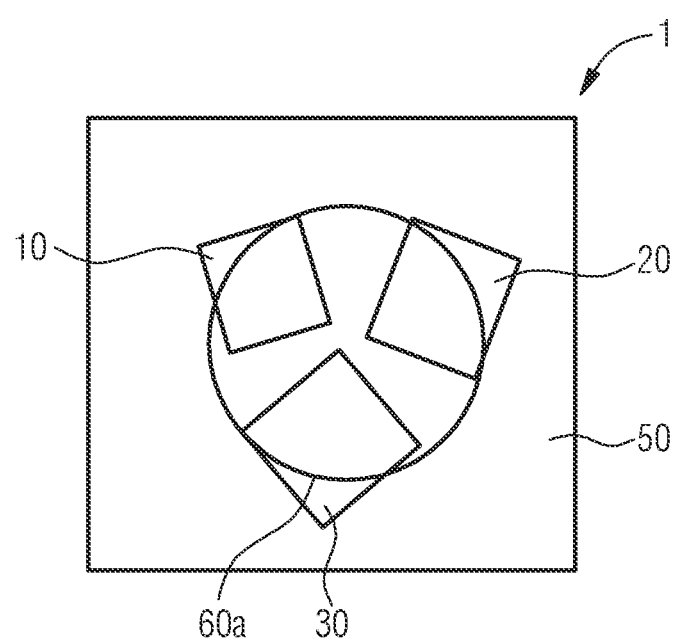

| | | | |
|---|---|---|---|
| 2018/0188457 A1 | 7/2018 | Law et al. | |
| 2019/0057957 A1 | 2/2019 | Xie | |

FOREIGN PATENT DOCUMENTS

| | | |
|---|---|---|
| CN | 101904005 A | 12/2010 |
| CN | 203115716 U | 8/2013 |
| DE | 213 792 A1 | 9/1984 |
| DE | 10 2011 017 098 A1 | 10/2012 |
| DE | 20 2005 022 114 U1 | 2/2014 |
| DE | 10 2016 109 308 A1 | 11/2017 |
| DE | 10 2018 117 591 A1 | 1/2020 |
| JP | H9-96745 A | 4/1997 |
| JP | 2003-5103 A | 1/2003 |
| JP | 2005-140822 A | 6/2005 |
| KR | 10-2009-0056981 A | 6/2009 |
| KR | 10-2010-0091992 A | 8/2010 |
| KR | 10-2010-0114042 A | 10/2010 |
| KR | 10-2010-0119526 A | 11/2010 |
| KR | 10-2013-0058708 A | 6/2013 |
| KR | 10-2017-0013910 A | 2/2017 |
| WO | 2016/150807 A1 | 9/2016 |
| WO | 2017/198548 A1 | 11/2017 |
| WO | 2019/145422 A1 | 8/2019 |

OTHER PUBLICATIONS

Written Opinion issued for corresponding International Patent Application No. PCT/EP2020/072416 on Oct. 26, 2020.

Liu et al., "The research of fiber-coupled high power diode laser", International Symposium on Photoelectronic Detection and Imaging, Oct. 19, 2011, Proc. of SPIE vol. 8192, p. 81922X-1~10 (10 pages).

Zhao, Passive and Active Devices of Cable Transmission System for Cable Television (vol. 2), Appliance Maintenance Technology, Issue 02, Feb. 1, 2013, pp. 56-57, with English Abstract.

* cited by examiner

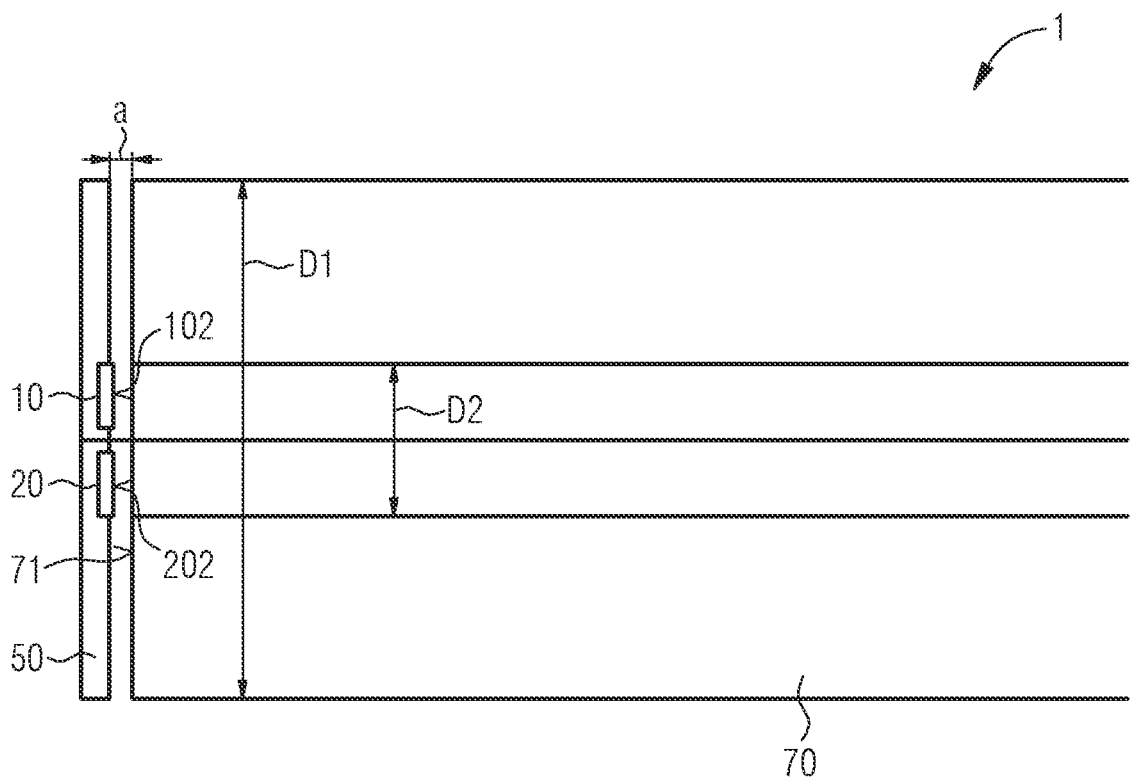

| | a=100 μm, b= 0 μm | a=100 μm, b= 30 μm |
|---|---|---|
| NA = 0,37 | 18,2 % | 11,3 % |
| NA = 0,5 | 30,9 % | 19,2 % |

OPTOELECTRONIC COMPONENT AND METHOD FOR PRODUCING AN OPTOELECTRONIC COMPONENT

CROSS REFERENCE TO RELATED APPLICATION

This application is a National Stage of International Application No. PCT/EP2020/072416, filed on Aug. 10, 2020, which designates the United States and was published in Europe, and which claims priority to German Patent Application No. 10 2019 121 881.0, filed on Aug. 14, 2019, in the German Patent Office. Both of the aforementioned applications are hereby incorporated by reference in their entireties.

An optoelectronic component and a method for producing an optoelectronic component are specified. An optoelectronic component is configured in particular for the generation and/or detection of electromagnetic radiation, preferably of light perceptible to the human eye.

A task to be solved is to specify an optoelectronic component which comprises a predeterminable coupling out window.

Another task to be solved is to specify a simplified method for producing an optoelectronic component with a predeterminable coupling out window.

According to at least one embodiment of the optoelectronic component, the latter comprises at least one first and at least one second semiconductor emitter, each with an active region. The active region is configured for the generation and/or detection of electromagnetic radiation and preferably comprises a pn junction, a double heterostructure, a single quantum well (SQW) structure or a multiple quantum well (MQW) structure for radiation generation or detection.

Further, each of the semiconductor emitters includes a front side coupling out area. The front side coupling out area is configured to couple out at least a portion of the electromagnetic radiation generated by the active region. The front side coupling out area is located in the direction of the main emission direction of the active regions. For example, a semiconductor emitter also comprises further coupling out areas which are aligned transversely, in particular perpendicularly, to the front side coupling out area. In particular, the optoelectronic component comprises a front side and a rear side opposite the front side. The front side is the side that lies in the direction of the main emission direction of the active regions.

According to at least one embodiment, the optoelectronic component or its embodiment described above comprises a radiation-impermeable cover layer. For example, the cover layer is formed with a polymer, in particular an epoxy, into which radiation-absorbing or radiation-reflecting particles are introduced. The cover layer reduces or prevents the transmission of electromagnetic radiation by comprising a high absorption or reflection coefficient. As a result, coupling out of electromagnetic radiation is preferably limited to the front side coupling out areas. A reflective cover layer, for example, helps to recycle electromagnetic radiation and thus increases the optical efficiency of the optoelectronic component in particular. The term radiation-impermeable also includes a highly absorbing or reflective cover layer that comprises a sufficiently low transmission for electromagnetic radiation.

According to at least one embodiment, the optoelectronic component or one of the embodiments described above comprises a carrier. The carrier serves in particular to mechanically stabilize the optoelectronic component. For example, the carrier is implemented as a flat and planar plate with a main extension direction. Preferably, all semiconductor emitters are arranged on the carrier in a common surface, in particular plane. Preferably, the carrier is formed with a polymer. The carrier comprises a first side. Preferably, the semiconductor emitters are arranged on the first side.

According to at least one embodiment of the optoelectronic component or one of the embodiments described above, the first semiconductor emitter is configured to emit electromagnetic radiation in a first wavelength range through its front side coupling out area and its coupling out area faces away from the carrier. For example, the first semiconductor emitter is a light emitting diode with a first wavelength range extending over 30 nm.

According to at least one embodiment of the optoelectronic component or one of the embodiments described above, the second semiconductor emitter is configured to emit electromagnetic radiation in a second wavelength range through its front side coupling out area and its coupling out area faces away from the carrier. For example, the second semiconductor emitter is a light emitting diode with a first wavelength range extending over 30 nm.

According to at least one embodiment of the optoelectronic component or one of the embodiments described above, the first and second wavelength ranges are at least partially different from each other. For example, the first and second wavelength ranges differ in that they partially overlap but comprise different peak wavelengths. The electromagnetic radiation from different wavelength ranges evokes a different color impression to an observer. Thus, by mixing electromagnetic radiation from the first and second wavelength ranges, a different color impression is advantageously generated.

For example, the first wavelength range is electromagnetic radiation in the green spectral range and the second wavelength range is electromagnetic radiation in the red wavelength range. By mixing the radiation from both wavelength ranges, for example, a mixed color is produced that is located on a standard chromaticity diagram on a straight line connecting the color locations of the first and second wavelength ranges.

According to at least one embodiment of the optoelectronic component or one of the embodiments described above, the cover layer is formed with a photopolymer. In particular, a photopolymer is a polymer compound comprising a photoinitiator. For example, when the photopolymer is irradiated with electromagnetic radiation of a particular wavelength, the photoinitiator causes a crosslinking reaction, thereby causing the polymer to cure. Alternatively, when the photoinitiator is irradiated with electromagnetic radiation, it causes bond dissolution and thus dissolution of the polymer. Common applications of photopolymers include photoresists for use in lithography.

According to at least one embodiment of the optoelectronic component or one of the embodiments described above, the cover layer is arranged on the first side of the carrier and comprises a coupling out window. The coupling out window completely penetrates the cover layer. Through the coupling out window, the coupling out areas are each at least partially free of the cover layer. The coupling out window comprises, for example, the shape of a circle or an ellipse. According to at least one embodiment of the optoelectronic component or one of the embodiments described above, the optoelectronic component comprises, at least one first and at least one second semiconductor emitter, each with an active region configured to generate electromagnetic radiation, and each with a front side coupling out area, a radiation-impermeable cover layer, and a carrier, wherein the semiconductor emitters are arranged on a first side of the carrier, and the first semiconductor emitter is configured to emit electromagnetic radiation in a first wavelength range through its coupling out area and its coupling out area faces away from the carrier, the second semiconductor emitter is configured to emit electromagnetic radiation in a second wavelength range through its coupling out area and its coupling out area faces away from the carrier, the first and second wavelength ranges are at least partially different from each other, and the cover layer is formed with a photopolymer, is arranged on the first side of the carrier and comprises a coupling out window which completely penetrates the cover layer and in which the coupling out areas are each at least partially free of the cover layer.

An optoelectronic component described herein is based inter alia on the following considerations: when coupling a plurality of semiconductor emitters into, for example, a downstream optical component with a coupling in area whose diameter is smaller than the extent of the coupling out areas of the semiconductor emitters in their main extension direction, the positioning of the coupling in area of the optical component is of great importance. The positioning of the optical component influences, inter alia, the fraction of electromagnetic radiation that is coupled into the optical component by each semiconductor emitter and thus also via a mixing ratio of the different electromagnetic radiations. Furthermore, the positioning as well as the distance between the coupling in area and the semiconductor emitters are decisive for the efficiency with which electromagnetic radiation is coupled into the optical component.

The optoelectronic component described here makes use, inter alia, of the idea of simplifying a positioning of the optical component in that a defined coupling out window is already generated at the desired position before the optical component is mounted. The position of the coupling out window is thus already determined during the manufacturing process of the optoelectronic component. This advantageously avoids a time-consuming determination of the position of the semiconductor emitter on the finished component. Furthermore, direct mounting of the visual component on the coupling out areas of the semiconductor emitters is simplified.

According to at least one embodiment of the optoelectronic component or one of the embodiments described above, the coupling out areas of the semiconductor emitters are arranged in a common coupling out plane. The plane of the coupling out areas is in particular flush with the first side of the carrier. The distance of the coupling out areas to the light guide decisively determines the coupling in efficiency of the respective semiconductor emitter. If all coupling out areas are located in a common coupling out plane, the coupling efficiency of all semiconductor emitters is approximately the same. Advantageously, the coupling efficiency of the individual semiconductor emitters is determined mainly by the position of the light guide.

According to at least one embodiment of the optoelectronic component or one of the embodiments described above, the cover layer is configured to absorb at least a major portion of the radiation emitted by the semiconductor emitters. A major portion corresponds here and hereinafter to a portion of at least 70% of the emitted radiation. Advantageously, the emission of the semiconductor emitters is thus limited only to the coupling out window.

According to at least one embodiment of the optoelectronic component or one of the embodiments described above, the cover layer is configured to reflect at least a major portion of the radiation emitted by the semiconductor emitters. Reflection of the electromagnetic radiation emitted by the semiconductor emitters contributes in particular to an increase in the efficiency of the semiconductor emitters. For example, the radiation reflected by the cover layer couples back into the semiconductor emitter and preferably exits at the coupling out window.

According to at least one embodiment of the optoelectronic component or one of the embodiments described above, the front side coupling out areas of the semiconductor emitters are free of contact structures. Preferably, the semiconductor emitters are backside contactable. In other words, the contacting takes place in particular on the rear side of the semiconductor emitters opposite the front side coupling out area. For example, the semiconductor emitters are designed as flip chips. In particular, the semiconductor emitters are contacted using a planar interconnect method. In the planar interconnect method, a bonding layer formed with Ti, Cr, Ni or Pd is first applied to a contact structure of the semiconductor emitter by means of sputtering. Subsequently, a growth layer is applied to the bonding layer by means of sputtering, which is formed with Cu, for example. In a further step, a connection layer formed with Cu is preferably electrodeposited on the growth layer. Consequently, an optoelectronic component contacted by means of the planar interconnect method preferably comprises a bonding layer, a growth layer and a connection layer on the rear side of the semiconductor emitter opposite the front side coupling out area.

According to at least one embodiment of the optoelectronic component or one of the embodiments described above, the cover layer comprises a thickness of at least 10 µm, preferably of at least 20 µm, and particularly preferably of at least 40 µm. The thickness of the cover layer corresponds here and in the following to its extension in a direction transverse, in particular perpendicular, to its main extension plane.

According to at least one embodiment of the optoelectronic component or one of the embodiments described above, the cover layer is formed as a multilayer and comprises a thickness of at least 100 µm, preferably of at least 400 µm. The thickness of the cover layer is advantageously flexibly adjustable in a multilayer structure. A greater thickness of the cover layer increases in particular the stability of the coupling out window.

According to at least one embodiment of the optoelectronic component or one of the embodiments described above, a light guide with a coupling in area is arranged in the coupling out window and the coupling in area of the light guide is aligned with the coupling out areas of the semiconductor emitters in such a way that, during operation of the semiconductor emitters, at least part of the electromagnetic radiation generated by the semiconductor emitters couples into the light guide. Preferably, the coupling in area of the light guide is aligned parallel to the front side coupling out areas of the semiconductor emitters.

Preferably, the light guide comprises optical fibers comprising a material selected from glass and plastic. Thus, the light guide also comprises optical fiber cables or optical fiber rods. In particular, the light guide comprises, in a cross-section, a core region with a first refractive index and a cladding region with a second refractive index. Preferably, the second refractive index is lower than the first refractive index. In particular, the core region is completely surrounded by the cladding region along its main extension direction. Thus, the core region is capable of transporting electromagnetic radiation preferably by means of interference and reflection along the main extension direction of the light guide.

Furthermore, the light guide comprises a numerical aperture (NA), which is influenced inter alia by the refractive indices of the core region and the cladding region of the light guide and the maximum acceptance angle. The acceptance angle describes a maximum angular range below which electromagnetic radiation can be coupled into the core region of the light guide and guided in the light guide. A larger numerical aperture, for example, advantageously facilitates the coupling of electromagnetic radiation from the semiconductor emitters into the light guide. The coupling of electromagnetic radiation from the semiconductor emitters into the light guide advantageously enables an increased design freedom to emit the electromagnetic radiation, for example along the light guide.

According to at least one embodiment of the optoelectronic component or one of the embodiments described above, a distance between the coupling in area of the light guide and the coupling out areas of the semiconductor emitters is at most 300 µm, preferably at most 100 µm and particularly preferably at most 1 µm. The smallest possible distance between the coupling in area of the light guide and the coupling out areas advantageously increases the coupling in efficiency of the semiconductor emitters. The coupling in efficiency into the light guide is determined inter alia by the numerical aperture of the light guide and the diameter of its coupling in area.

According to at least one embodiment of the optoelectronic component or one of the embodiments described above, the light guide is formed with an optical fiber. Glass fibers comprise in particular advantageous transmission properties and are particularly insensitive to temperatures of several 100° C.

According to at least one embodiment of the optoelectronic component or one of the embodiments described above, the light guide comprises a core diameter between 100 µm and 1000 µm, preferably between 550 µm and 650 µm. The diameter of the core region of the light guide determines, inter alia, its transmission properties. For example, a larger core diameter increases the size of the coupling in area of the light guide and consequently facilitates the coupling of electromagnetic radiation into the light guide.

According to at least one embodiment of the optoelectronic component or one of the embodiments described above, a radiation-permeable protective layer is arranged between the semiconductor emitters and the light guide. The radiation-permeable protective layer is preferably formed with clear silicone. The protective layer protects the semiconductor emitters in particular from any environmental influences. For example, the semiconductor emitters are protected from moisture or dirt particles by means of the protective layer before mounting a light guide.

Furthermore, a method for producing an optoelectronic component is specified. In particular, the method is used to produce an optoelectronic component described herein. That is, all features disclosed for the optoelectronic component are also disclosed for the method, and vice versa.

According to at least one embodiment of the method for producing an optoelectronic component, at least two semiconductor emitters are provided, each with an active region configured for generating electromagnetic radiation, each with a front side coupling out area on a first side of a carrier.

Thereby, the first semiconductor emitter is configured to emit electromagnetic radiation in a first wavelength range through its front side coupling out area. The second semiconductor emitter is configured to emit electromagnetic radiation in a second wavelength range through its front side coupling out area. The first and second wavelength ranges are at least partially different from each other.

According to at least one embodiment of the method or one of the embodiments described above, a determination of positions of the coupling out areas of the semiconductor emitters on the carrier is performed. The determination of the position of the coupling out area serves, in particular, to calculate a desired position of a subsequently applied coupling out window. When determining the position of the coupling out areas, the extent and the shape of the coupling out areas are also recorded in particular. The positions are preferably determined relative to a fixed point on the carrier. For example, a fixed point is given by a corner of the carrier.

According to at least one embodiment of the method or one of the embodiments described above, a calculation of a position of a coupling out window is performed on the basis of the positions of the front side coupling out areas, taking as a basis specified coupling in portions of the electromagnetic radiation emitted by the semiconductor emitters in each case. For example, the position of the coupling out window is calculated using the centroids of the surfaces forming the coupling out areas. For example, the position of the coupling out window covers a larger portion of the coupling out area of the first semiconductor emitter if a larger portion of the radiation coupled out by the first semiconductor emitter is desired. Furthermore, the extent and shape of the coupling out window, for example, are also included in the calculation of the position of the coupling out window. The position of the coupling out window is preferably determined relative to the fixed point.

According to at least one embodiment of the method or one of the embodiments described above, a radiation-impermeable cover layer formed with a photopolymer is applied to the first side of the carrier. The cover layer is applied to the carrier, for example, by spinning.

According to at least one embodiment of the method or one of the embodiments described above, a coupling out window is created in the cover layer at the predetermined position, which fully penetrates the cover layer. The coupling out window is preferably formed by a recess. For example, the coupling out window is configured to map the cross-sectional area of a light guide. In particular, the coupling out window is circular.

According to at least one embodiment of the method or one of the embodiments described above, after step E), a radiation-permeable protective layer is arranged in the coupling out window. Preferably, the protective layer is formed with a clear silicone. The radiation-permeable protective layer is arranged in the coupling out window by means of dispensing, jetting or spraying, for example.

According to at least one embodiment of the method or one of the embodiments described above, a light guide is arranged in the coupling out window of the cover layer. The light guide is preferably arranged in the coupling out window in such a way that it completely fills the coupling out window in a direction transverse to the main extension direction of the cover layer. This results in the smallest possible distance between the light guide and the semiconductor emitters. The smallest possible distance between the coupling in area of the light guide and the coupling out area of the semiconductor emitters enables particularly good coupling of electromagnetic radiation into the light guide.

According to at least one embodiment of the method or one of the embodiments described above, the light guide is fixed in the coupling out window by means of an adhesive. In particular, the adhesive is formed with a cyanoacrylate. Preferably, the light guide is bonded to the cover layer by means of the adhesive.

According to at least one embodiment of the method or one of the embodiments described above, the determination of the position of the coupling out areas of the semiconductor emitters on the carrier in step B) is carried out by means of a visual detection. For example, the positions of the front side coupling out areas of the semiconductor emitters are determined by means of a camera image. The camera image is evaluated, for example, by means of suitable computer-aided methods, in order to determine the positions and extents of the coupling out areas. In particular, the position of the fixed point on the carrier is also detected during the visual detection.

According to at least one embodiment of the method or one of the embodiments described above, the cover layer is formed with a photopolymer and patterned using a Laser Direct Imaging method. The laser direct imaging (LDI) method enables a layer to be exposed with pinpoint accuracy in accordance with a predeterminable pattern. For example, a photopolymer layer is thus exposed by means of laser radiation according to a specified pattern at a specified position.

Advantageously, this method does not require a mask for exposing the photopolymer.

By means of the LDI method, it is possible in particular to create an opening, for example circular, to accommodate a light guide at a desired position. The LDI method allows any desired shape of the coupling out window and is thus advantageously also suitable for, for example, elliptical or angular shapes of the coupling out window.

In accordance with at least one embodiment of the method or one of the embodiments described above, the semiconductor emitters are electrically contacted by means of a planar interconnect method. The planar interconnect method includes contacting by means of thin metallic layers and with thin metallic bonding films. In the planar interconnect method, a bonding layer formed with Ti, Cr, Ni or Pd is first applied to the contact structures of the semiconductor emitter by means of sputtering. Subsequently, a growth layer is applied to the bonding layer by means of sputtering, which is formed with Cu, for example. In a further step, for example, a connection layer formed with Cu is electrodeposited on the growth layer. Advantageously, contacting takes place exclusively on a rear side of the semiconductor emitter opposite the front side coupling out area. The coupling out area on the front side is thus free of contact structures in particular.

According to at least one embodiment of the method or one of the embodiments described above, the coupling out areas will be arranged in a common coupling out plane. Preferably, the alignment of the semiconductor emitters is performed when the semiconductor emitters are mounted on the carrier. The arrangement in one plane simplifies a uniform coupling of the semiconductor emitters into a subsequent optical system, for example a light guide.

An optoelectronic component described above is particularly suitable for use in the interior lighting of an automobile, for example the lighting of a car seat. Furthermore, the optoelectronic component is suitable for use as a woven-in illuminant in textiles.

Further advantages and advantageous designs and further embodiments of the optoelectronic component result from the following exemplary embodiments shown in connection with the figures.

Figure 4B:
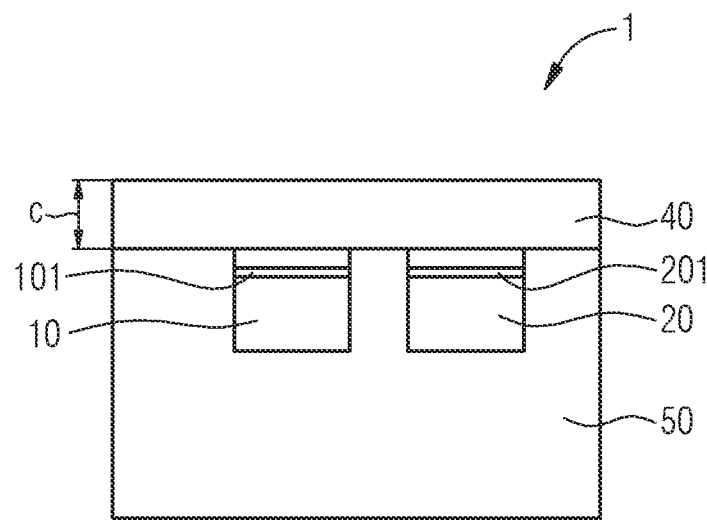
Figure 5A:
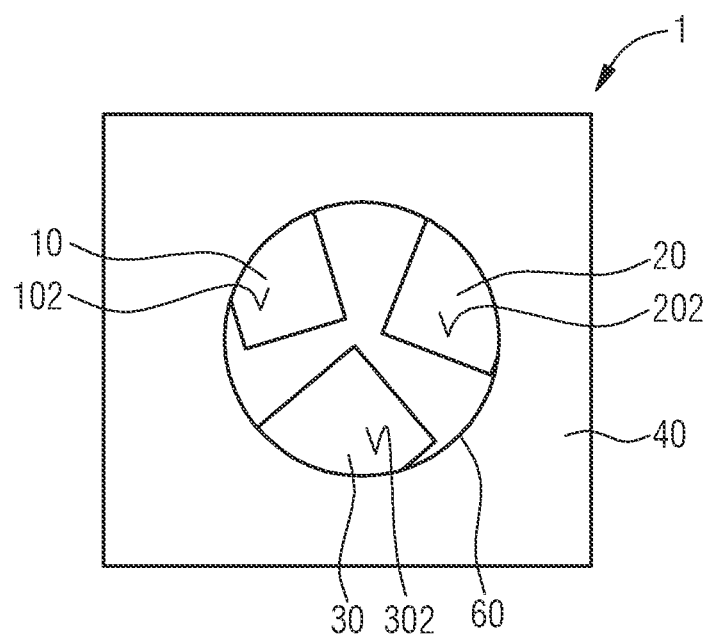
Figure 5B:
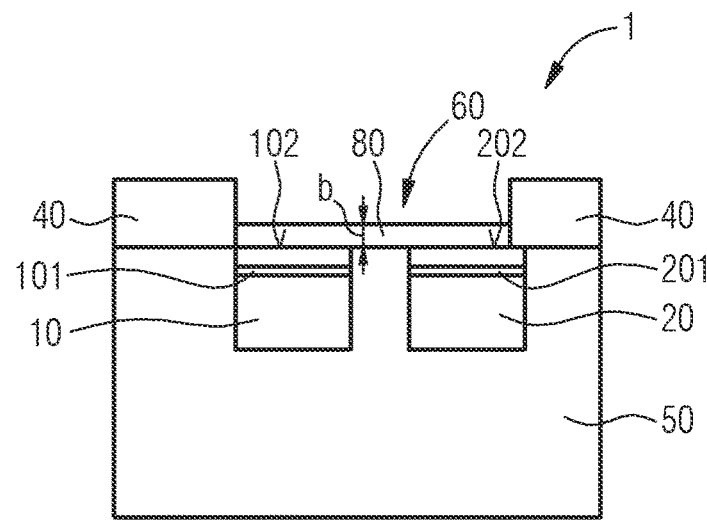
Figure 6:
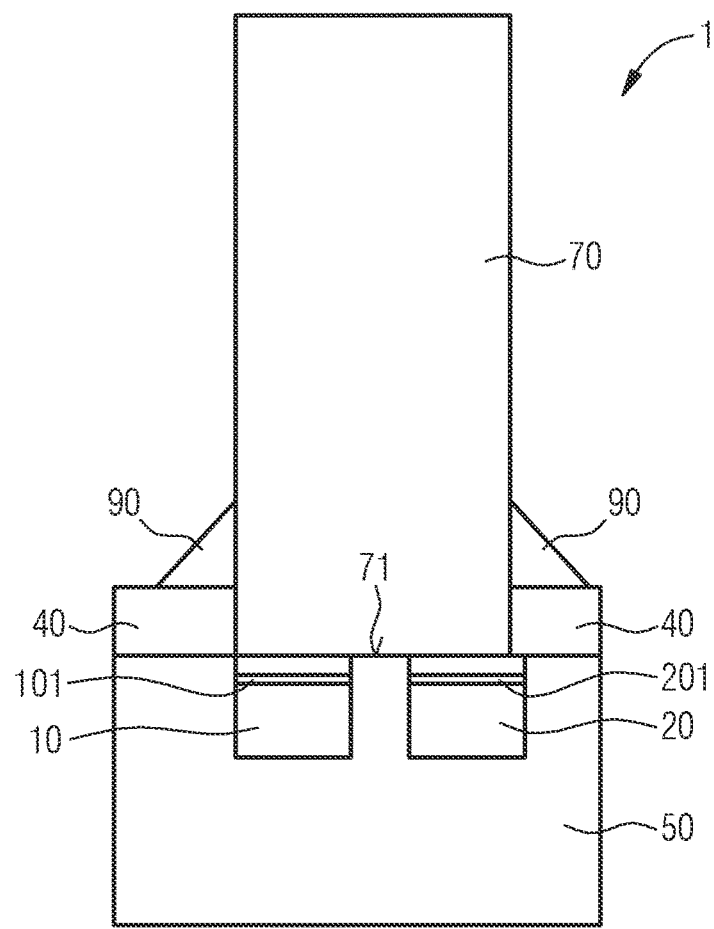

Showing in:

FIG. 1 a schematic sectional view of an optoelectronic component described herein according to a first exemplary embodiment, FIGS. 2 and 3 tables of coupling efficiencies, FIG. 4A a schematic sectional view of a top view of an optoelectronic component described herein according to a second exemplary embodiment, FIG. 4B a schematic sectional view of an optoelectronic component described herein according to the second exemplary embodiment, FIG. 5A a schematic top view of an optoelectronic component described herein according to a third exemplary embodiment, FIG. 5B a schematic sectional view of an optoelectronic component described herein according to the third exemplary embodiment, and FIG. 6 a schematic sectional view of an optoelectronic component described herein according to a fourth exemplary embodiment.

Elements that are identical, similar or have the same effect are marked with the same reference signs in the figures. The figures and the proportions of the elements shown in the figures with respect to one another are not to be regarded as to scale. Rather, individual elements may be shown exaggeratedly large for better representability and/or for better comprehensibility.

FIG. 1 shows a schematic sectional view of an optoelectronic component 1 described herein according to a first exemplary embodiment. A first semiconductor emitter 10 and a second semiconductor emitter 20 are mounted on a carrier 50. The first semiconductor emitter 10 includes a first front side coupling out area 102, and the second semiconductor emitter 20 includes a second front side coupling out area 202. The front side coupling out areas 102, 202 are aligned in a common coupling out plane.

A light guide 70 is disposed downstream of the carrier 50 on its side facing the outcoupling plane. The light guide 70 comprises a coupling in area 71 and is spaced a distance a from the coupling out plane. The light guide 70 comprises a cladding diameter D1 and a core diameter D2. The material of the core region of the light guide 70 comprises a different refractive index from the material surrounding it. For example, the refractive index of the core region is higher than that of the cladding region surrounding it. The electromagnetic radiation guided in the light guide 70 propagates predominantly in the core region of the light guide. The core region of the light guide comprises a diameter D2 of 600 µm.

FIG. 2 shows a table of coupling efficiencies as a function of a numerical aperture NA and a distance a of the light guide 70 from a semiconductor emitter 10. The coupling efficiencies shown correspond to the portion of the electromagnetic radiation that is coupled into the light guide 70 by the semiconductor emitter 10. Based on the values of the coupling efficiencies, it can be clearly seen that a larger numerical aperture NA and a smaller distance a of the light guide 70 from the semiconductor emitter 10, contributes to an advantageously increased coupling efficiency.

The coupling efficiency at a distance of 1 µm and using a light guide 70 with a numerical aperture NA of 0.5 is up to 35.5%.

FIG. 3 shows a table of coupling in efficiencies as a function of the thickness b of a protective layer 80. The protective layer 80 is, for example, a radiation-permeable, preferably transparent layer on the coupling out area of a semiconductor emitter 10. The protective layer 80 comprises a refractive index different from that of air, as a result of which, in particular, undesired reflection of electromagnetic radiation occurs at the interfaces of the protective layer 80.

The table in FIG. 3 shows the coupling efficiency into a light guide 70 with a fixed distance a of 100 µm and a varying thickness b of the protective layer 80 between 0 µm and 30 µm for two different light guides 70 with varying numerical apertures NA. Without a protective layer 80, a coupling efficiency of 30.9% can be achieved with a numerical aperture of 0.5. A protective layer 80 with a thickness b of 30 µm reduces the coupling efficiency to 19.2% with a numerical aperture of 0.5 of the same size. A reduced numerical aperture NA of 0.37 also reduces the coupling efficiency to 11.3% with a protective layer 80.

A protective layer 80 thus reduces the coupling efficiency due to total internal reflection at the interfaces of the protective layer 80 to air. A larger numerical aperture NA advantageously contributes to a higher coupling efficiency. The use of an as thin as possible, or the complete absence of a protective layer 80, contributes advantageously to an increased coupling efficiency.

FIG. 4A shows a schematic sectional view of a top view of an optoelectronic component 1 described herein according to a second exemplary embodiment. The top view of the optoelectronic component 1 shows a first semiconductor emitter 10, a second semiconductor emitter 20 and a third semiconductor emitter 30. The different semiconductor emitters 10, 20, 30 are each configured to emit electromagnetic radiation in different wavelength ranges.

The first semiconductor emitter 10 is configured to emit electromagnetic radiation in the red wavelength range, the second semiconductor emitter 20 is configured to emit electromagnetic radiation in the blue wavelength range, and the third semiconductor emitter 30 is configured to emit electromagnetic radiation in the green wavelength range. The semiconductor emitters 10, 20, 30 form an RGB pixel. Advantageously, it is thus possible to display a colored mixed radiation whose color locus lies in a triangle in the color space spanned by the three different color loci of the semiconductor emitters 10, 20, 30.

The semiconductor emitters 10, 20, 30 are arranged side by side on a carrier 50. The positions of the semiconductor emitters 10, 20, 30 and the size of the front side coupling out areas are determined, for example, by means of visual detection. In particular, the positions of the front side coupling out areas of the semiconductor emitters 10, 20, 30 are already known from a preceding process step in which the semiconductor emitters 10, 20, 30 were positioned on the carrier 50.

Based on the known positions and sizes, it is possible to calculate a position of a coupling out window 60A. The position of the coupling out window 60A influences the coupling efficiency and the coupled-in portions of the respective semiconductor emitters 10, 20, 30 into a subsequently following optical component. Thus, in particular, the highest possible coupling efficiency for all semiconductor emitters 10, 20, 30 into a subsequent visual component is achieved.

For example, based on a desired specified mixed color, the coupling out window 60 will thus also cover a relatively larger portion of the first front side coupling out area 102 of the first semiconductor emitter 10, for example, in order to couple a mixed color with a color location shifted into the red into a subsequent optical component.

FIG. 4B shows a schematic sectional view of an optoelectronic component 1 described herein according to the second exemplary embodiment. In the sectional view it can be seen that the semiconductor emitters 10, 20 are embedded in the carrier 50. The semiconductor emitter 10 comprises a first active region 101 and the semiconductor emitter 20 comprises a second active region 201. The active regions 101, 201 are configured to emit electromagnetic radiation of different wavelength ranges and comprise a pn junction.

A cover layer 40 is arranged on the front side coupling out areas 102, 103 of the semiconductor emitters 10, 20. The cover layer 40 is formed with a radiation-impermeable material. In particular, the cover layer 40 is formed with a photopolymer. The cover layer 40 comprises a thickness c of 200 µm. In particular, the cover layer 40 comprises a multilayer structure with a plurality of layers of the photopolymer.

FIG. 5A shows a schematic top view of an optoelectronic component 1 described herein according to a third exemplary embodiment. In the top view of the optoelectronic component 1, a first semiconductor emitter 10, a second semiconductor emitter 20 and a third semiconductor emitter 30 are shown. The different semiconductor emitters 10, 20, 30 are each configured to emit electromagnetic radiation in different wavelength ranges.

The semiconductor emitters 10, 20, 30 are at least partially covered by a cover layer 40. A coupling out window 60 is introduced in the cover layer 40. The coupling out window 60 is a cavity in the cover layer 40 that completely penetrates the cover layer 40 and at least partially exposes the front side coupling out areas 101, 102, 103 of the semiconductor emitters 10, 20, 30.

The patterning of the cover layer 40 and thus the generation of the coupling out window 60 is performed by means of an LDI (laser direct imaging) exposure of the cover layer 40. LDI allows the exposure of a photopolymer without the use of a mask. In particular, any shape that a laser beam can image on the photopolymer can be produced in this way.

Thus, at the pre-calculated position of the coupling out window 60A, a coupling out window 60 is patterned in the cover layer 40. By means of a selective etching process, the material of the resist layer 40 is completely removed in the exposed region of the coupling out window 60.

FIG. 5B shows a schematic sectional view of an optoelectronic component 1 described herein according to the third exemplary embodiment. In the sectional view, it can be seen that a radiation-permeable protective layer 80 is arranged on the side of the semiconductor emitter 10, 20 facing the coupling out areas 102, 202, 302. The protective layer 80 is arranged in the coupling out window 60. The protective layer 80 completely covers the front side coupling out areas 102, 202, 302. The radiation-permeable protective layer 80 comprises a thickness b and is formed with a silicone. The protective layer 80 protects the semiconductor emitters 10, 20, 30 from external environmental influences, such as moisture and/or oxidation.

FIG. 6 shows a schematic sectional view of an optoelectronic component 1 described herein according to a fourth exemplary embodiment. The fourth exemplary embodiment is substantially the same as the third exemplary embodiment shown in FIGS. 4A and 4B.

A light guide 70 is arranged in the coupling out window 60 and fixed by means of an adhesive 90. The coupling in area 71 is arranged with a distance a of 1 µm at the front side coupling out areas 102, 202, 302 of the semiconductor emitters 10, 20, 30. The adhesive 90 partially extends into the coupling out window 60 and is preferably designed to be radiation-permeable. The light guide 70 together with the adhesive 90 protects the semiconductor emitters 10, 20, 30 from external environmental influences, so that a protective layer 60 is advantageously dispensable. Without a protective layer 80, a particularly close mounting of the light guide 70 is possible with a small distance a of the coupling in area 71 to the front side coupling out areas 102, 202, 302 of the semiconductor emitters 10, 20, 30. The coupling of electromagnetic radiation from the semiconductor emitters 10, 20, 30 into the light guide 70 thus advantageously takes place particularly efficiently.

The invention is not limited by the description based on the exemplary embodiments. Rather, the invention encompasses any new feature as well as any combination of features, which particularly includes any combination of features in the patent claims, even if that feature or combination itself is not explicitly specified in the patent claims or exemplary embodiments.

LIST OF REFERENCE SIGNS

1 optoelectronic component
10 first semiconductor emitter
20 second semiconductor emitter
30 third semiconductor emitter
101 first active region
102 first front side coupling out area
201 second active region
202 second front side coupling out area
301 third active region
302 third front side coupling out area
40 cover layer
50 carrier
60 coupling out window
60a position of coupling out window
70 light guide
71 coupling in area
80 protective layer
90 adhesive
D1 cladding diameter of the light guide
D2 core diameter of the light guide
a distance of the light guide from the coupling out plane
b thickness of the protective layer
c thickness of the cover layer

The invention claimed is:

1. An optoelectronic component comprising
at least one first semiconductor emitter and at least one second semiconductor emitter, each with an active region configured to generate electromagnetic radiation, and each with a front side coupling out area,
a radiation-impermeable cover layer, and
a carrier, wherein
the semiconductor emitters are arranged on a first side of the carrier,
the first semiconductor emitter is configured to emit electromagnetic radiation in a first wavelength range through its coupling out area and its coupling out area faces away from the carrier,
the second semiconductor emitter is configured to emit electromagnetic radiation in a second wavelength range through its coupling out area and its coupling out area faces away from the carrier,
the first and second wavelength ranges are at least partially different from each other,
the cover layer is formed with a photopolymer, is arranged on the first side of the carrier and comprises a coupling out window which completely penetrates the cover layer and in which the coupling out areas are each at least partially free of the cover layer, and
the cover layer is configured to reflect at least a major part of the radiation emitted by the semiconductor emitters.

2. The optoelectronic component according to claim 1, in which the coupling out areas of the semiconductor emitters are arranged in a common coupling out plane.

3. The optoelectronic component according to claim 1, in which the cover layer is configured to absorb part of the radiation emitted by the semiconductor emitters.

4. The optoelectronic component according to claim 1, in which the front side coupling out areas of the semiconductor emitters are free of contact structures.

5. The optoelectronic component according to claim 1, in which the cover layer comprises a thickness of at least 10 µm, preferably of at least 20 µm and particularly preferably of at least 40 µm.

6. The optoelectronic component according to claim 1, in which the cover layer comprises a multilayer structure and comprises a thickness of at least 100 µm, preferably of at least 400 µm.

7. The optoelectronic component according to claim 1, wherein a light guide with a coupling in area is arranged in the coupling out window, wherein
the coupling in area of the light guide is aligned with the coupling out areas of the semiconductor emitters such that, in operation, at least part of the electromagnetic radiation emitted by the semiconductor emitters couples into the light guide.

8. The optoelectronic component according to claim 7, in which a distance between the coupling in area of the light guide and the coupling out areas is at most 300 µm, preferably at most 100 µm and particularly preferably at most 1 µm.

9. The optoelectronic component according to claim 7, in which the light guide is formed with an optical fiber.

10. The optoelectronic component according to claim 7, in which the light guide comprises a core diameter between 100 µm and 1000 µm, preferably between 550 µm and 650 µm.

11. The optoelectronic component according to claim 7, in which a radiation-permeable protective layer is arranged between the semiconductor emitters and the light guide.

12. A method for producing an optoelectronic component, comprising the following steps:
A) providing at least two semiconductor emitters each with an active region configured to generate electromagnetic radiation and each with a front side coupling out area, on the first side of a carrier, wherein
the first semiconductor emitter is configured to emit electromagnetic radiation in a first wavelength range through its coupling out area,
the second semiconductor emitter is configured to emit electromagnetic radiation in a second wavelength range through its coupling out area,
the first and second wavelength ranges are at least partially different from each other,
B) determining positions of the coupling out areas of the semiconductor emitters on the carrier, C) calculating a position of a coupling out window based on the positions of the coupling out areas using specified coupling in portions of the electromagnetic radiation emitted from the semiconductor emitters, respectively, D) applying a radiation-impermeable cover layer formed with a photopolymer to the first side of the carrier, E) creating the coupling out window in the cover layer at the predetermined position that completely penetrates the cover layer, wherein the cover layer is configured to reflect at least a major part of the radiation emitted by the semiconductor emitters.

13. The method for producing an optoelectronic component according to claim 12, wherein a radiation-permeable protective layer is arranged in the coupling out window after step E).

14. The method for producing an optoelectronic component according to claim 12, wherein a light guide is arranged in the coupling out window.

15. The method for producing an optoelectronic component according to claim 14, wherein the light guide is fixed in the coupling out window by means of an adhesive.

16. The method for producing an optoelectronic component according to claim 12, wherein the determination of the position of the coupling out areas of the semiconductor emitters on the carrier in step B) is performed by means of a visual detection.

17. The method for producing an optoelectronic component according to claim 12, wherein the cover layer is formed with a photopolymer and patterned by means of a laser direct imaging process.

18. The method for producing an optoelectronic component according to claim 12, wherein the semiconductor emitters are electrically contacted by means of a planar interconnect process.

19. The method for producing an optoelectronic component according to claim 12, wherein the coupling out areas are arranged in a common coupling out plane.

20. An optoelectronic component comprising
at least one first semiconductor emitter and at least one second semiconductor emitter, each with an active region configured to generate electromagnetic radiation, and each with a front side coupling out area,
a radiation-impermeable cover layer, and
a carrier, wherein
the semiconductor emitters are arranged on a first side of the carrier,
the first semiconductor emitter is configured to emit electromagnetic radiation in a first wavelength range through its coupling out area and its coupling out area faces away from the carrier,
the second semiconductor emitter is configured to emit electromagnetic radiation in a second wavelength range through its coupling out area and its coupling out area faces away from the carrier,
the first and second wavelength ranges are at least partially different from each other,
the cover layer is formed with a photopolymer, is arranged on the first side of the carrier and comprises a coupling out window which completely penetrates the cover layer and in which the coupling out areas are each at least partially free of the cover layer, and
the cover layer comprises a multilayer structure and comprises a thickness of at least 100 μm, preferably of at least 400 μm.

* * * * *